(12) United States Patent
Bartley et al.

(10) Patent No.: US 7,472,360 B2
(45) Date of Patent: Dec. 30, 2008

(54) METHOD FOR IMPLEMENTING ENHANCED WIRING CAPABILITY FOR ELECTRONIC LAMINATE PACKAGES

(75) Inventors: Gerald Keith Bartley, Rochester, MN (US); Darryl John Becker, Rochester, MN (US); Paul Eric Dahlen, Rochester, MN (US); Philip Raymond Germann, Oronoco, MN (US); Andrew Benson Maki, Rochester, MN (US); Mark Owen Maxson, Mantorville, MN (US); Trevor Joseph Timpane, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/423,988

(22) Filed: Jun. 14, 2006

(65) Prior Publication Data

US 2007/0294653 A1 Dec. 20, 2007

(51) Int. Cl.
*G06F 17/50* (2006.01)
*H03K 17/693* (2006.01)

(52) U.S. Cl. .......................................... 716/2; 716/15
(58) Field of Classification Search .................. 716/5, 716/2, 15
See application file for complete search history.

(56) References Cited

U.S. PATENT DOCUMENTS

| 6,184,581 B1 | 2/2001 | Cornell et al. |
| 6,534,872 B1 | 3/2003 | Freda et al. |
| 2007/0124709 A1* | 5/2007 | Li et al. .......................... 716/5 |

* cited by examiner

*Primary Examiner*—Jack Chiang
*Assistant Examiner*—Suresh Memula
(74) *Attorney, Agent, or Firm*—Joan Pennington

(57) ABSTRACT

A method is provided for implementing enhanced wiring capability for electronic laminate packages. Electronic package physical design data are received. Instances of line width and space limit violations in the electronic package physical design data are identified. The identified instances of line width and space limit violations are evaluated using predefined qualified options and tolerance limitations and the electronic package physical design data are modified to optimize shapes to replace the instances of line width and space limit violations.

4 Claims, 8 Drawing Sheets

US 7,472,360 B2

METHOD FOR IMPLEMENTING ENHANCED WIRING CAPABILITY FOR ELECTRONIC LAMINATE PACKAGES

FIELD OF THE INVENTION

The present invention relates generally to the data processing field, and more particularly, relates to a method, structures and computer program product for implementing enhanced wiring capability for electronic laminate packages.

DESCRIPTION OF THE RELATED ART

As used in the present specification and claims, the term electronic laminate package includes an electronic build-up laminate package, a printed circuit board (PCB) or other electrical interconnection structure including a substrate or multiple layers (multi-layer) of substrates used to electrically attach electrical components and should be understood to generally include circuit cards, printed circuit cards, printed wiring cards, and printed wiring boards.

U.S. Pat. No. 6,184,581 to Cornell et al., issued Feb. 6, 2001, discloses a monolithic surface mount (SM) semiconductor device, such as a flip chip or integrated circuit, having bead-like terminals formed on one of its surfaces with forming shaped input/output pads on the surface mount circuit device including various pad shapes. The shape of each pad is selectively formed to favorably affect the distribution, shape and height of a solder bump connection formed on the pads following reflow soldering of the device to a conductor pattern on the substrate. Shapes include those with the input/output pad elongate in a direction perpendicular to an edge of the circuit device.

U.S. Pat. No. 6,534,872 to Freda et al., issued Mar. 18, 2003, discloses electrical interconnection devices (EIDs), such as printed wiring boards, semiconductor packages, and printed circuit boards, having increased signal trace routing options with various via and signal trace positioning. The vias may be positioned off-center from the pattern of the surface pads. Via groups, or staircase vias, connect surface pads with vias extending into the electrical interconnection device. The via groups convert the pad geometry on the surface to a more open via pattern on one or more internal layers. The EID comprises a plurality of pads formed on a surface for providing electrical connections to another EID. A plurality of vias each extend from a corresponding pad to another layer of the printed wiring board. Each via is offset from a central location of its corresponding pad. A via group comprises a plurality of vias with a first via connecting a surface of the electrical interconnection device to a first inner layer electrically connects a pad on a surface of the electrical interconnection device to a second via. The second via extends from the first inner layer to a second layer of the electrical interconnection device. The centers of the first via and the second via are non-collinear. Another EID includes a uniformly spaced set of pads on the surface. Via groups, comprising a first set of vias and a second set of vias, extend from the uniformly spaced surface pads. Spacing among the second set of vias is non-uniform.

A need exists for an efficient and effective method to increase wireability for electronic laminate packages. Typically the known solutions today include using tighter manufacturing controls with tighter ground rules. However, only a limited group of suppliers today can provide such tighter manufacturing controls.

SUMMARY OF THE INVENTION

A principal aspect of the present invention is to provide a method implementing enhanced wiring capability for laminate packages. Other important aspects of the present invention are to provide such method for implementing enhanced wiring capability for laminate packages substantially without negative effect and that overcome many of the disadvantages of prior art arrangements.

In brief, a method is provided for implementing enhanced wiring capability for electronic laminate packages. Electronic package physical design data are received. Instances of line width and space limit violations in the electronic package physical design data are identified. The identified instances of line width and space limit violations are evaluated using predefined qualified options and tolerance limitations and the electronic package physical design data are modified to optimize shapes to replace the instances of line width and space limit violations.

In accordance with features of the invention, the electronic package physical design data includes a design file for an electronic laminate package and line width and space requirements. The predefined qualified options and tolerance limitations are used for evaluating and replacing the identified instances of line width and space limit violations include predefined package connection pads having predefined shapes to allow increased wiring space between connection pads and predefined sizes to maintain solder volume within the tolerance limitations for the electronic laminate package.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the invention, a method is provided to increased wireability for laminate packages. Conventional solutions require using tighter manufacturing controls with tighter ground rules, which only a limited group of suppliers today can provide. This method may also increase the capability of those limited suppliers as well. Opening up the ability to allow the lower cost supplier to compete will help reduce laminate packaging costs through higher manufacturing yields while also increasing wiring capability. This also improves electrical performance by being able to escape wider traces with larger spaces. Avoiding the conventional neck-down traces advantageously can eliminate impedance discontinuities in this area.

In accordance with features of the invention, an algorithm or computer program product is used to determine and modify the shape of the package pads slightly to allow more wiring space between pads while maintaining a nearly equivalent solder structure for the connection. The final pad shape and solder volume should fall within the specified tolerances of the qualified acceptable limits. This algorithm or computer program product uses these limits as inputs to determine the allowable shapes.

Figure 1:
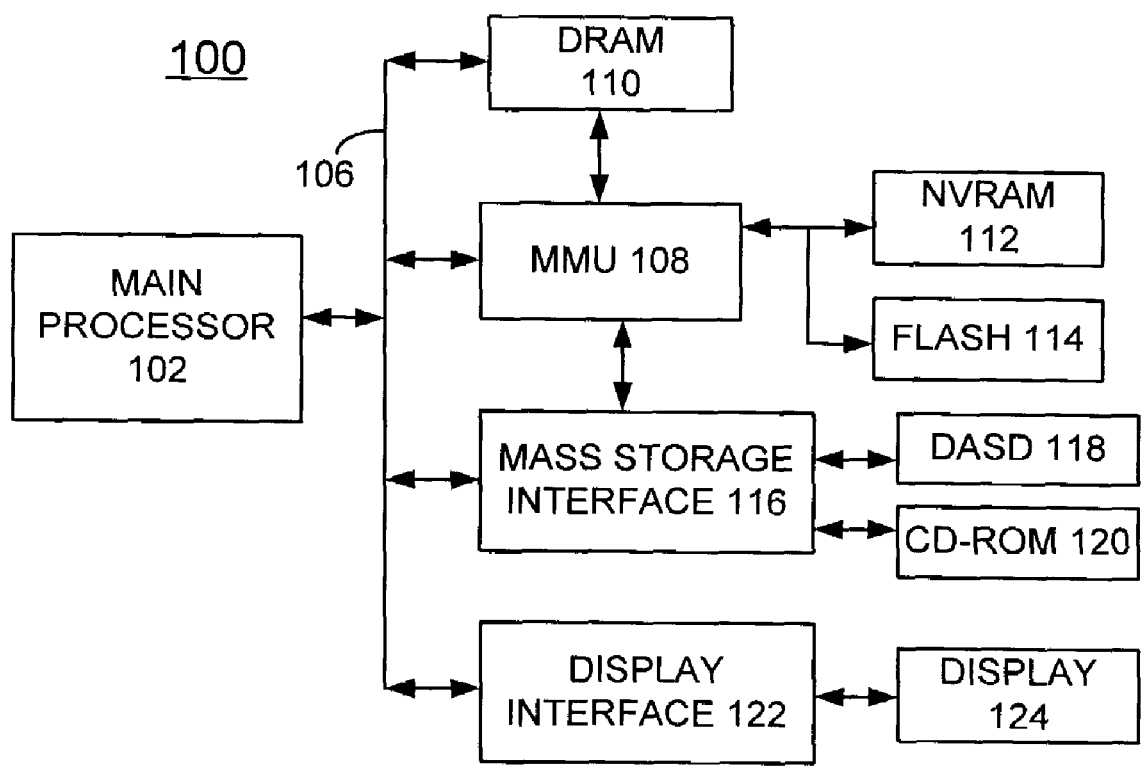
FIGS. 1 and 2 are block diagram representations illustrating a computer system and operating system for implementing enhanced wiring capability for electronic laminate packages in accordance with the preferred embodiment.
Figure 2:
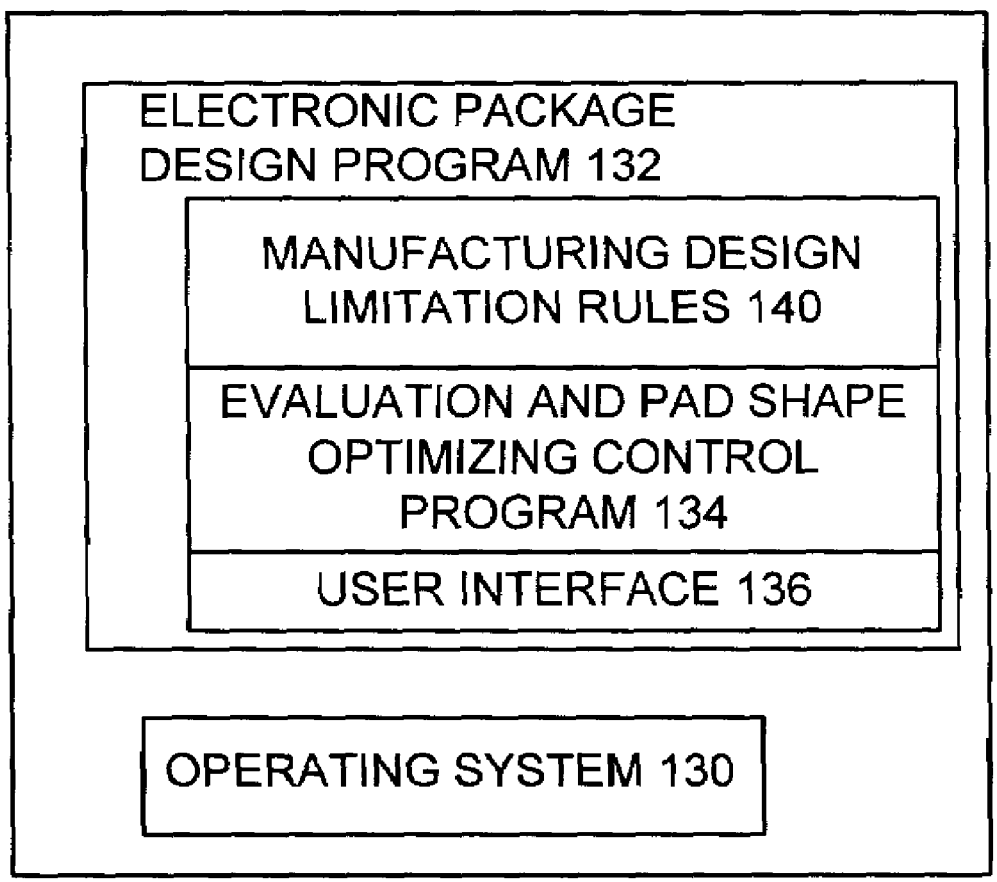

Referring now to the drawings, in FIGS. 1 and 2 there is shown a computer system generally designated by the reference character 100 for implementing methods for creating enhanced wiring capability in an electronic laminate package in accordance with the preferred embodiment. Computer system 100 includes a main processor 102 or central processor unit (CPU) 102 coupled by a system bus 106 to a memory management unit (MMU) 108 and system memory including a dynamic random access memory (DRAM) 110, a nonvolatile random access memory (NVRAM) 112, and a flash memory 114. A mass storage interface 116 coupled to the system bus 106 and MMU 108 connects a direct access storage device (DASD) 118 and a CD-ROM drive 120 to the main processor 102. Computer system 100 includes a display interface 122 coupled to the system bus 106 and connected to a display 124.

Computer system 100 is shown in simplified form sufficient for understanding the present invention. The illustrated computer system 100 is not intended to imply architectural or functional limitations. The present invention can be used with various hardware implementations and systems and various other internal hardware devices, for example, multiple main processors.

As shown in FIG. 2, computer system 100 includes an operating system 130, an electronic package design program 132, an evaluation and pad optimizing control program 134 of the preferred embodiment, a user interface 136, and manufacturing design limitation rules 140.

Various commercially available computers can be used for computer system 100, for example, an IBM personal computer. CPU 102 is suitably programmed by the evaluation and pad optimizing control program 134 to execute the flowchart of FIG. 3 for implementing methods for creating enhanced wiring capability in an electronic laminate package in accordance with the preferred embodiment.

In accordance with features of the invention, an algorithm or evaluation and pad optimizing control program 134 determines, for example, an appropriate modification of the flip-chip pad structure or other shape on the surface of an electronic laminate package to allow more space for wiring while maintaining an equivalent solder volume with a nearly identical pad and solder structure. This method can optimize the package substrate design for enhanced manufacturing yields within the bounds of the qualified or known limits of the technology. A significant advantage is that once the modification to the pad has been provided there is virtually no further cost involved in manufacturing processes to increase the wiring capability of the laminate package suppliers. An additional advantage is the ability to maintain a constant wire width for an entire trace by avoiding neck-downs, and maintain substantially continuous characteristic impedance for the trace.

Figure 3:
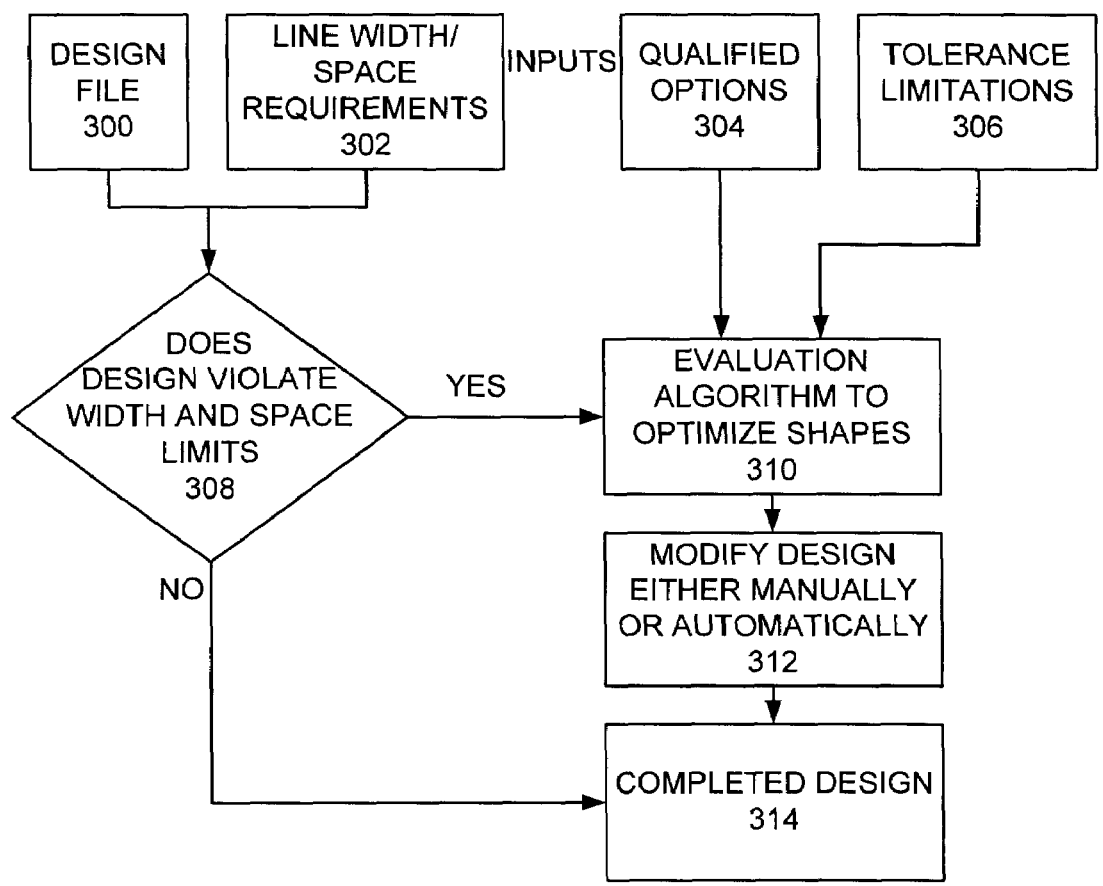
FIG. 3 is a flow chart illustrating exemplary sequential steps for implementing enhanced wiring capability for electronic laminate packages in accordance with the preferred embodiment.

Referring now to FIG. 3, there are shown exemplary steps for implementing enhanced wiring capability in an electronic laminate package in accordance with the preferred embodiment. Electronic package physical design data and system design inputs for an electronic laminate package are received as indicated in a plurality of blocks 300, 302, 304, and 306. Received physical design data includes a design file at block 300, system design inputs including line width and space requirements at block 302, qualified options at block 304, and tolerance limitations at block 306.

As indicated in a decision block 308, it is determined whether the received design at block 300 violates predefined width and space limits provided at block 302. When the received design violates predefined width and space limits, instances of line width and space limit violations are evaluated as indicated in a block 310 using predefined qualified options from block 304 and tolerance limitations from block 306 to optimize shapes. The electronic package physical design data are modified to optimize shapes to replace the instances of line width and space limit violations, either manually or automatically, in the generated modified design as indicated in a block 312. A completed design is provided as indicated in a block 314.

Figure 4:
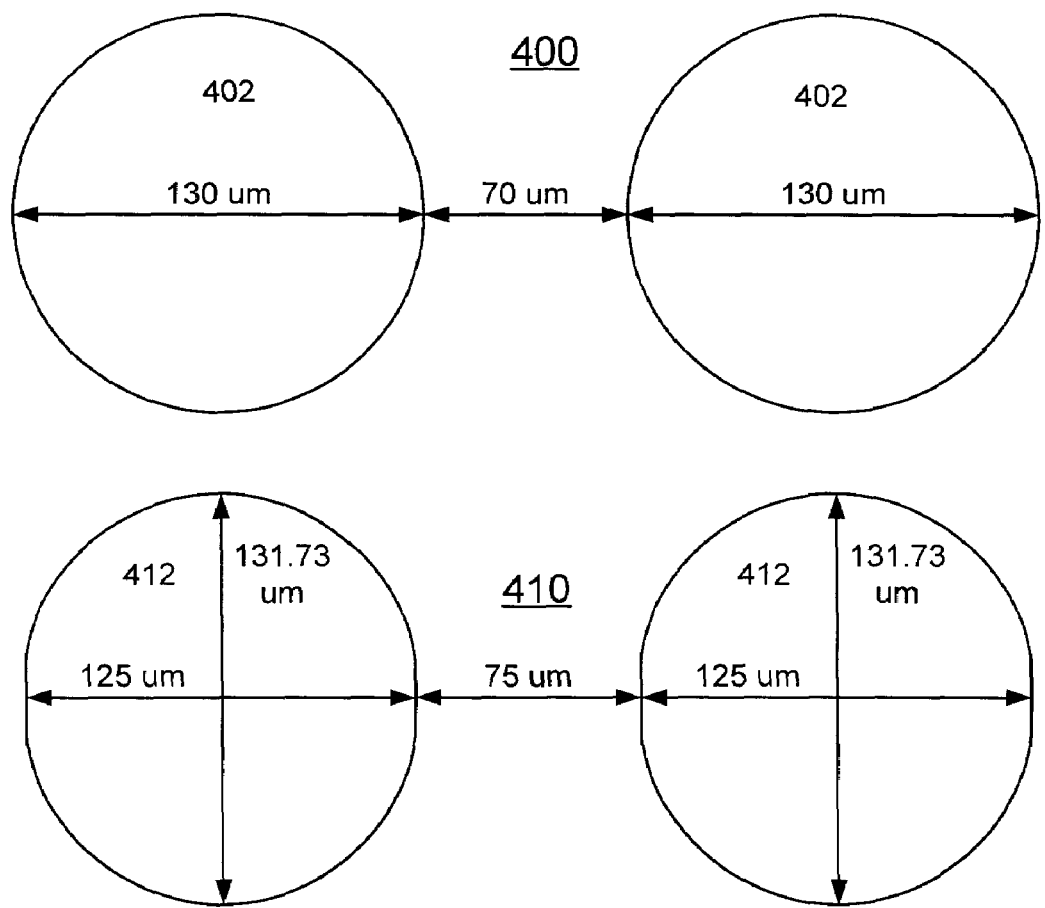
FIG. 4 is a diagram illustrating a first exemplary pad arrangement and a second exemplary pad shape arrangement for implementing enhanced wiring capability in an electronic laminate package in accordance with the preferred embodiment.

Referring also to FIG. 4, there is shown a first exemplary laminate pad structure generally designated by reference character 400 including a pair of spaced apart pads 402. Pads 402 are circular, for example, having a diameter of 130 μm and are spaced apart by 70 μm. A second exemplary laminate pad structure generally designated by reference character 410 includes a pair of spaced apart pads 412. Pads 412 have a height greater than a width, for example, having a diameter of 130 μm and are spaced apart by 75 μm. In the pad structure 410 the shape of pads 412 is slightly modified, and is located, for example, on the outer row of C4 pads to allow wider traces. In the pad structure 410 the shape of pads 412 is modified to increase the wiring channel while keeping the total pad area the same. The 130 μm pads 412 in an outer row have 2.5 μm sliced off each side while elongating the pad in a wiring direction by 1.73 μm. The space between pads 412 increases, for example, to allow a 5 μm wider trace between pads, which would improve the manufacturing yield of the substrate provider while keeping the total assembled solder volume the same for pads 412 and pads 402. Since the solder volume remains the same for pads 412 and pads 402, and the pad 412 is elongated in a radial direction from the neutral point, the fatigue life can be improved, or at least kept the same. The elongated pad 412 is in the same axis as at least one of the major components of fatigue, for example, coefficient of thermal expansion (TCE)—global distance to neutral point (DNP) or TCE-DNP related strains.

Figure 5:
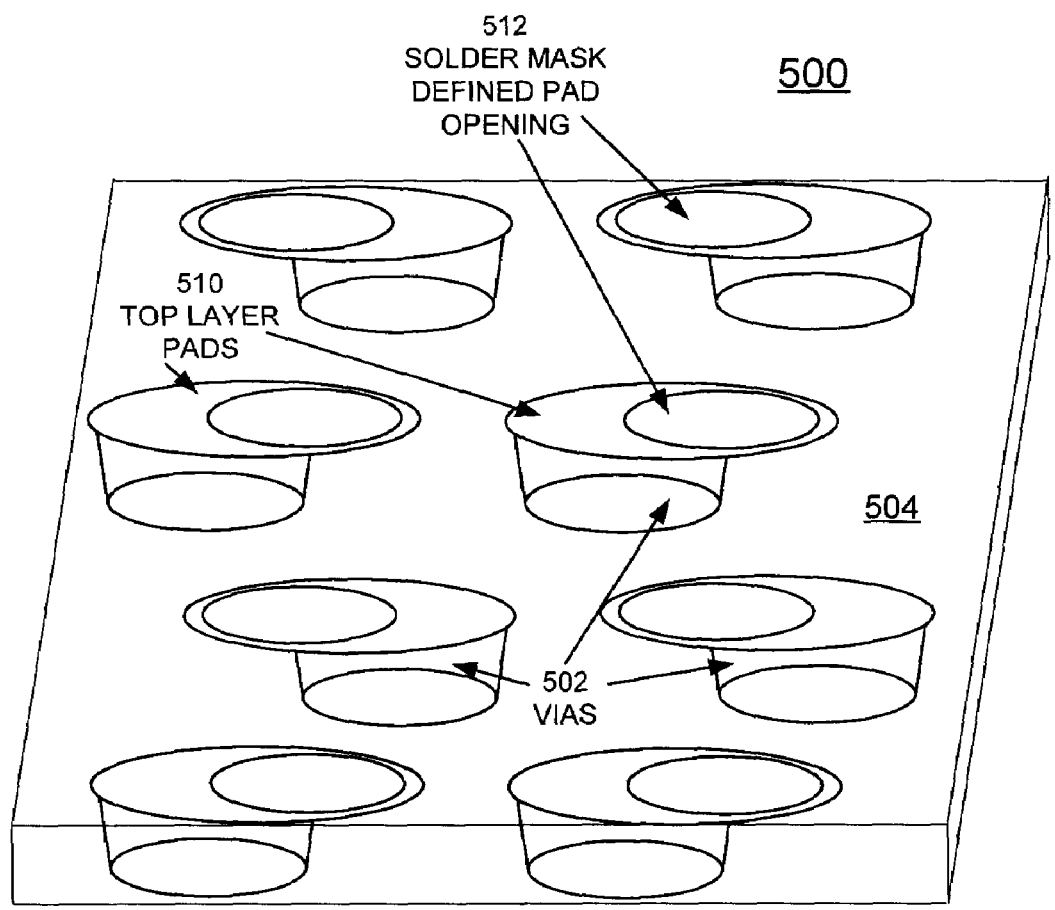
FIGS. 5, 6, and 7 are diagrams illustrating additional multiple pad and wiring arrangements of electronic laminate packages in accordance with the preferred embodiment.

Referring also to FIG. 5, there is shown an exemplary laminate structure 500 including a staggered array of vias 502 extending through the top two layers of a substrate 504. Laminate structure 500 includes a plurality of upper level connection pads 510 each including a respective solder mask defined pad opening 512. The upper level connection pads 510 are connected to a respective via 502. As shown, the upper level connection pads 510 are generally oblong with each respective solder mask defined pad opening 512 located near an end of the oblong connection pad 510. The solder mask defined pad openings 512 are aligned in a symmetrical array of rows and columns.

Figure 6:
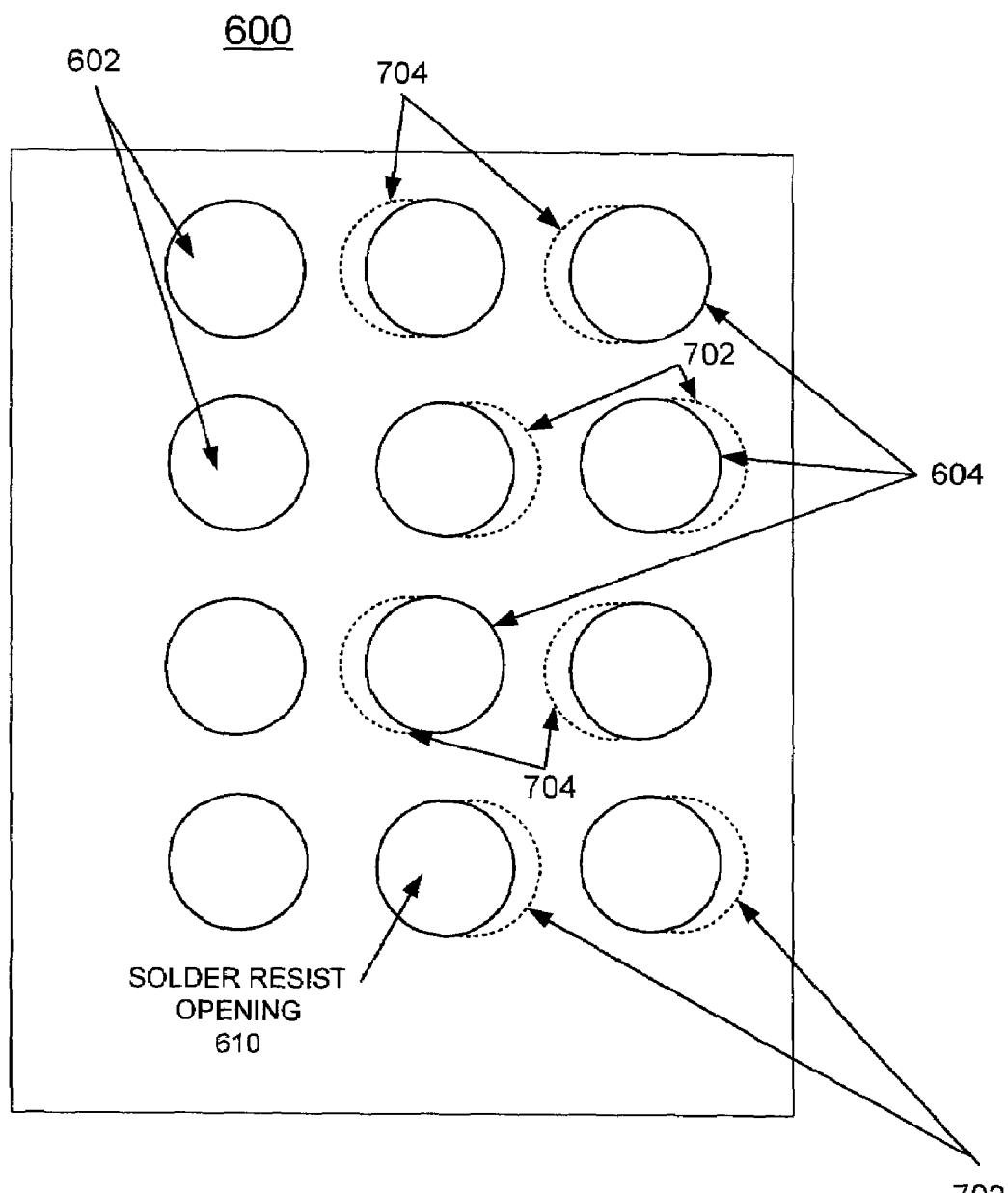

Referring also to FIG. 6, there is shown an exemplary laminate structure upper layer 600 including a plurality of first connection pads 602 and a plurality of second connection pads 604 together arranged in an array. The first connection pads 602 do not drop down further than the laminate structure top layer 600 and do not have associated vias. Each of the plurality of second connection pads 604 is connected to a respective one of first and second lower layer pads 702, 704 that are illustrated in dotted line in FIG. 6, and illustrated and described with respect to FIG. 7. A via (not shown), such as shown in FIG. 5, connects the plurality of second connection pads 604 to each respective lower pad 702, 704. A respective solder resist opening indicated by a reference character 610 is defined within the respective second connection pads 604.

Figure 7:
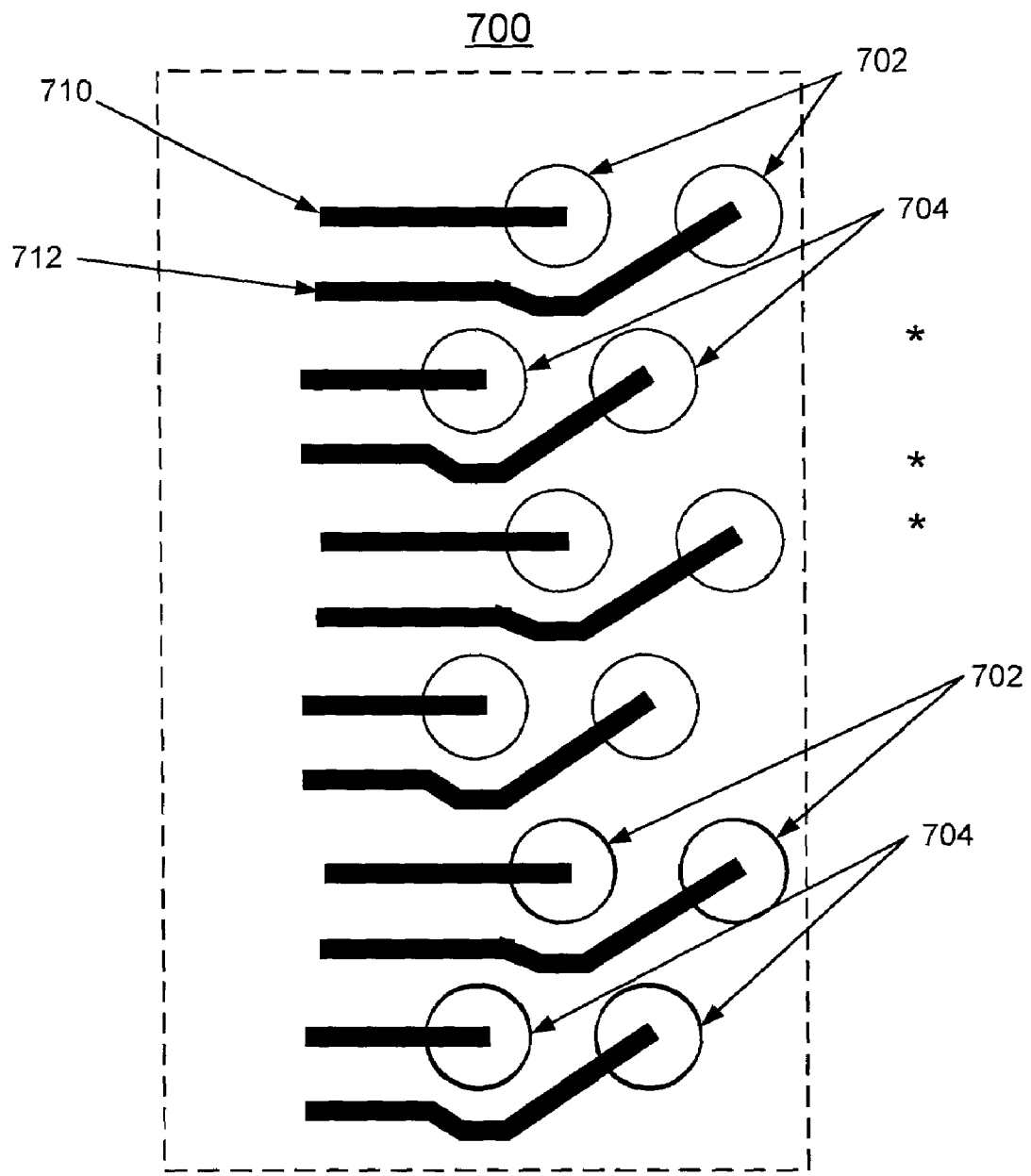

Referring also to FIG. 7, there is shown an exemplary laminate structure lower layer 700 including multiple pairs of the first connection pads 702 and multiple pairs of the second connection pads 704. The first connection pads 702 and the second connection pads 704 are sequentially arranged in alternating rows in the laminate structure lower layer 700. The alternating rows of first connection pads 702 and second connection pads 704 are arranged staggered or horizontally offset from each other. A respective pair of wiring traces 710, 712 is connected to each pair of first connection pads 702, and is connected to each pair of second connection pads 704. The wiring traces 710 extend along a line and are connected to an inner one of the respective first and second connection pads 702, 704. The wiring traces 712 include a shaped portion extending between the respective inner one of the first connection pads 702 and the second connection pads 704 and are connected to an outer one of the respective first and second connection pads 702, 704. Since the spacing between pads 702 and 704 is greater than the spacing between pads 604 in FIG. 6, wider wiring traces can be used.

Figure 8:
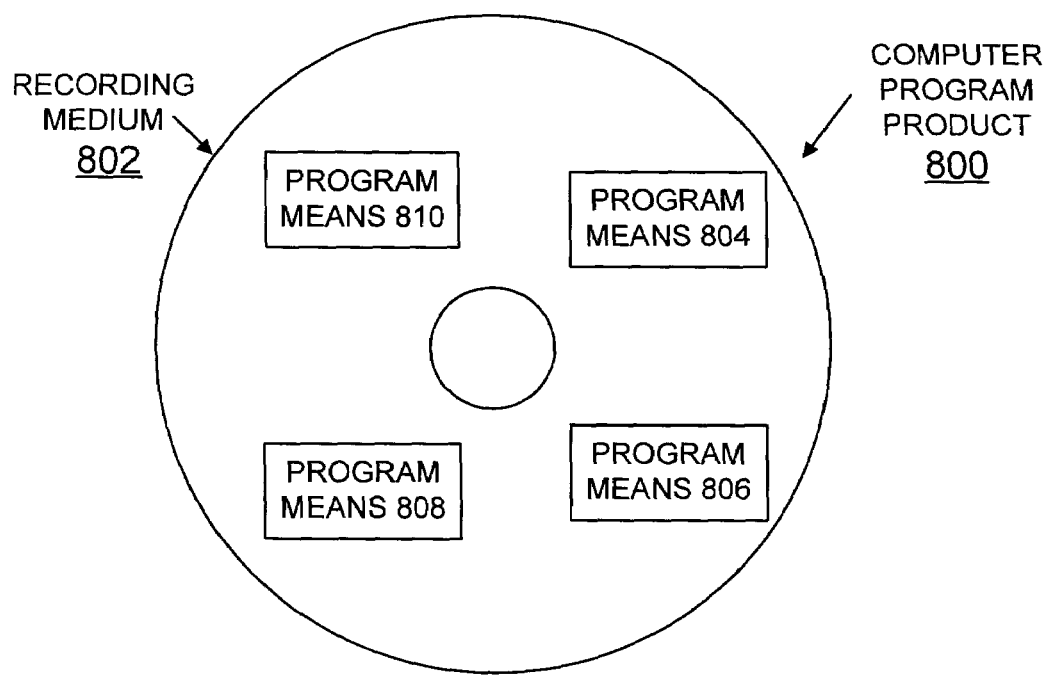
FIG. 8 is a block diagram illustrating a computer program product in accordance with the preferred embodiment.

Referring now to FIG. 8, an article of manufacture or a computer program product 800 of the invention is illustrated. The computer program product 800 includes a recording medium 802, such as, a floppy disk, a high capacity read only memory in the form of an optically read compact disk or CD-ROM, a tape, a transmission type media such as a digital or analog communications link, or a similar computer program product. Recording medium 802 stores program means 804, 806, 808, 810 on the medium 802 for carrying out the methods for implementing enhanced wiring capability for electronic laminate packages of the preferred embodiment in the system 100 of FIGS. 1 and 2.

A sequence of program instructions or a logical assembly of one or more interrelated modules defined by the recorded program means 804, 806, 808, 810, direct the computer system 100 for implementing enhanced wiring capability for electronic laminate packages of the preferred embodiment.

While the present invention has been described with reference to the details of the embodiments of the invention shown in the drawing, these details are not intended to limit the scope of the invention as claimed in the appended claims.

What is claimed is:

1. A computer-implemented method for implementing enhanced wiring capability for electronic laminate packages comprising the steps of:

receiving electronic package physical design data;

identifying instances of line width and space limit violations in the electronic package physical design data;

evaluating the identified instances of line width and space limit violations using predefined qualified options and tolerance limitations;

modifying shapes of predefined package connection pads and maintaining total connection pad area with predefined sizes of the modified connection pads to provide increased wiring space between the modified connection pads, to enlongate the modified connection pad along a predefined axis of a fatigue strain component, and to maintain solder volume within the tolerance limitations for the electronic laminate package; and modifying the electronic package physical design data to optimize shapes to replace the instances of line width and space limit violations.

2. A method for implementing enhanced wiring capability as recited in claim 1 wherein the step of receiving electronic package physical design data includes receiving a design file for an electronic laminate package and receiving line width and space requirements.

3. A method for implementing enhanced wiring capability as recited in claim 1 wherein the step of modifying the electronic package physical design data to optimize shapes to replace the instances of line width and space limit violations includes modifying the electronic package physical design data using the predefined qualified options and tolerance limitations.

4. A method for implementing enhanced wiring capability as recited in claim 1 wherein the step of modifying the electronic package physical design data to optimize shapes to replace the instances of line width and space limit violations includes a manual or automatic design modification.

* * * * *